United States Patent [19]

Willmore

[11] 4,396,894
[45] Aug. 2, 1983

[54] DIGITAL NOISE GENERATING APPARATUS

[75] Inventor: Robert R. Willmore, Millersville, Md.

[73] Assignee: Westinghouse Electric Corp., Pittsburgh, Pa.

[21] Appl. No.: 847,469

[22] Filed: Oct. 25, 1977

[51] Int. Cl.³ .................. H03B 29/00; H03B 3/84
[52] U.S. Cl. ............................ 331/78; 343/18 E; 343/1
[58] Field of Search ............... 331/78; 364/717; 325/132; 343/18 E; 455/1

[56] References Cited
U.S. PATENT DOCUMENTS
3,659,219  4/1972  Rueff, Jr. .................. 331/78

4,056,788 11/1977 Brown et al. .................. 331/78

Primary Examiner—Siegfried H. Grimm
Attorney, Agent, or Firm—H. W. Patterson

[57] ABSTRACT

A digital noise generator, wherein pseudo-random rapidly changing analog input voltages to a voltage controlled oscillator are used to generate corresponding rapidly changing discrete frequency outputs, is disclosed. Means are provided to delay the oscillator output by an amount at least equal to the rise time between each frequency change. The delayed and non-delayed oscillator outputs are electrically coupled through a switch that operates at times and at a rate to eliminate the rise time between frequency changes and thus improve the frequency spectrum.

7 Claims, 3 Drawing Figures

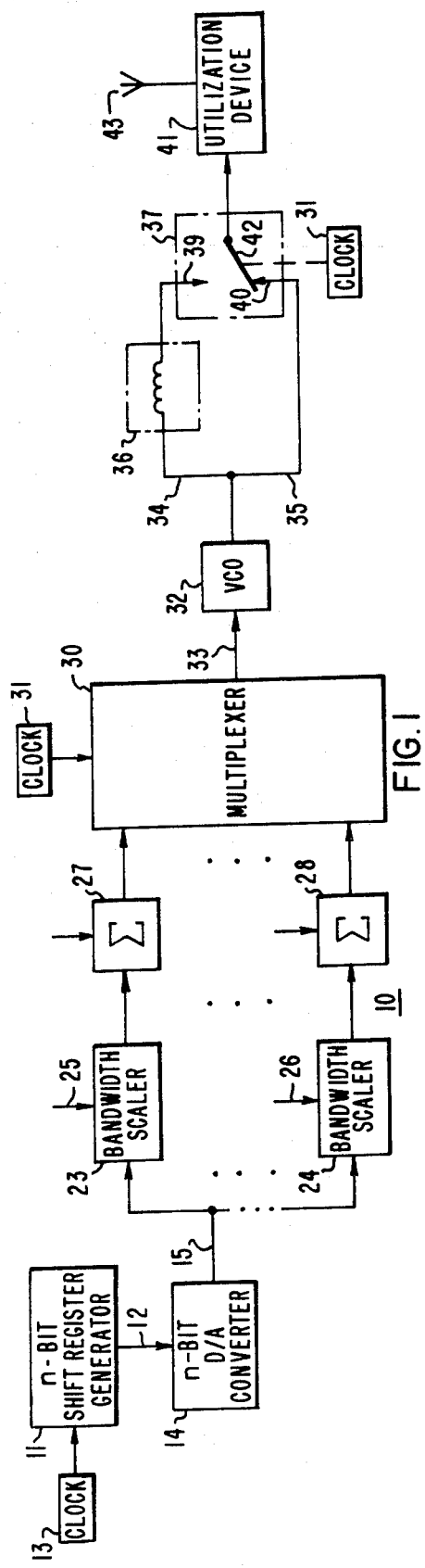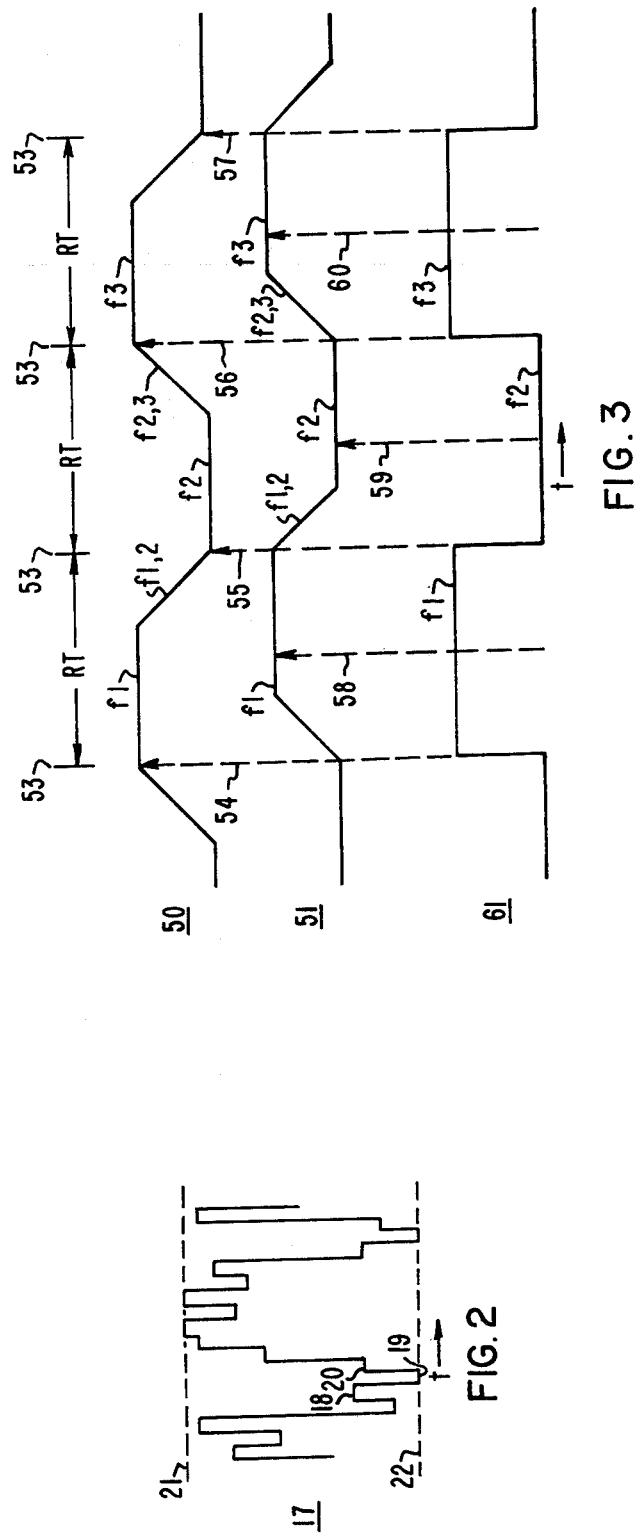

DIGITAL NOISE GENERATING APPARATUS

BACKGROUND OF THE INVENTION

1. Field of the Invention

The present invention relates to noise generating apparatus, and more particularly to digital noise generating apparatus for producing rapidly changing discrete output frequencies.

2. Description of the Prior Art

Noise generating apparatus of the type that produces rapidly changing discrete output frequencies is well known in the art. Such apparatus has been used, for example, in suppressing the effectiveness of hostile radar. With the advent of more sophisticated radars operating at different unknown frequencies over various bandwidths, it is necessary to be able to generate different frequencies in random succession in different bandwidths rapidly in order to provide effective jamming of one or more radar installations. More recently, digital noise generators were developed which generate a psuedo-random sequence of digital binary numbers. This sequence is converted to a discretely varying analog voltage that is applied to a linearized voltage controlled oscillator (VCO). The output of the VCO is a flat spectrum with a bandwidth proportional to the peak to peak voltage swing of the analog voltage.

The flatness and the quality of the frequency spectrum at the output of the VCO is proportional to the ratio of the time at each frequency step to the VCO rise time or in other words the time to reach the next frequency step. Thus, when it is desired to generate random frequency steps at a rate of approximately six megahertz or 160 nanoseconds, with a relatively slow rise time of from thirty to fifty nanoseconds, for example, power is lost to unwanted frequencies; and the frequency spectrums tend to become distorted. Such distortion can be minimized, of course, by utilizing VCO's with extremely fast response times; i.e., less than ten nanoseconds, accurate linearity and precise calibration which substantially increases the cost of the system.

Therefore, it is desirable to provide a noise generating apparatus, which is capable of providing random frequency steps at a rapid rate with good spectral quality, a minimum of power loss due to unwanted frequencies; and yet be capable of utilizing less expensive voltage controlled oscillators having slower response times.

SUMMARY OF THE INVENTION

A digital noise generating apparatus, comprising a means to generate binary numbers in pseudo-random succession at a predetermined rapid rate. The digital numbers, each of which represents a frequency step are converted to an analog voltage and input to a linear voltage controlled oscillator. One output of the oscillator produces direct or non-delayed frequency steps. A means for delaying the frequency steps is coupled to the one output to produce frequency steps that are delayed by an amount at least equal to the time required to reach each next frequency step. The output of the generating apparatus is coupled to the delayed and non-delayed frequency steps through a fast acting switch that operates to conduct alternating one of each of the delayed and non-delayed frequency steps during the rise time of the other of each such delayed and non-delayed frequency step.

BRIEF DESCRIPTION OF THE DRAWINGS

FIG. 1 is a schematic diagram of a noise generating apparatus in accordance with an embodiment of the invention;

FIG. 2 is a waveform to illustrate a typical analog voltage waveform for generating the discrete frequencies; and FIG. 3 are representative waveforms of the output of the embodiment of FIG. 1 to illustrate the principles of operation of the system.

DESCRIPTION OF THE PREFERRED EMBODIMENT

Referring to FIG. 1, a noise generating system of the present invention is generally referred to as 10; and includes a conventional shift register generator 11 that is made up of a plurality of flip-flop circuits, and functions to output digital words in pseudo-random succession. The number of different digital outputs is $2^n - 1$ where n is the number of flip-flop stages. The rate at which such words or codes are output at 12 is determined by clock pulses from a conventional clock 13. A digital to analog converter 14 converts the digital outputs of the generator 11 to an analog voltage which varies in discrete steps, with each step value on line 15 being representative of one of the successive random words. As shown in FIG. 2, the analog voltage referred to by the waveform 17 varies in discrete steps such as shown by portions 18, 19 and 20 between limits referred to at 21 and 22. The analog voltage is connected in parallel to a plurality of multipliers 23 and 24 which multiply the incoming voltage steps by a suitable factor on respective inputs 25 and 26 which scales the input and voltage 17 to provide a plurality of bandwidths. Each of the scaled voltages from 23 and 24 are suitably biased at their associated summing devices 27 and 28, to determine the center frequency of the bandwidth. Although only two parallel connected scales 23 and 24 and summers 27 and 28 are illustrated it is to be understood that such number utilized may be more or less and will depend on the number of bandwidths required for a particular installation.

The random frequencies for each of the scaled bandwidths are input to an analog switch 30 that is operated by a clock 31, which is identical to clock 13, to multiplex the individual analog voltage steps for each of the selected bandwidths. For analog voltage steps that change at intervals of 160 nanoseconds for example, with four different bandwidths; then the clock 31 should operate the switch to output in sequence a frequency step for the different bandwidths at a one hundred sixty nanosecond rate, for example. The analog switch 30 may be any one of several conventional fast electronic switches well known in the art.

The rapidly changing voltage steps from the switch 30 are input to a voltage controlled oscillator (VCO) 32 over a line 33. The VCO 32 generates a frequency via lines 34 and 35 that corresponds to the voltage level applied to its input 33.

The VCO output 34 includes a delay device 36, which may be any suitable device such as a coaxial cable for example, or an RF delay device that delays the frequency steps by an amount that is preferably slightly greater than the rise time between each new frequency step, or in other words slightly greater than the time required by the VCO to change from one discrete frequency to another. The frequency steps on the commonly connected line 35 are direct or non-delayed.

The non-delayed output 35 and the delayed output 34 of the VCO32 are connected to a double pole single throw switch 37, which is operated by clock pulses from a clock 38, such that the delayed and non-delayed frequency steps appearing at terminals 39 and 40 of the switch 37 are conducted to a utilization device 41 in accordance with the closed position of contact 42. The switch 37 although represented in functional form for simplicity of description, is preferably a fast PIN diode RF switch similar to the type manufactured by Anaren, model number 80627. The switch 37, of course, may be of any type that is capable of operating to close its contacts at a rate sufficiently fast to conduct a portion of each one of the delayed or non-delayed frequency steps during the rise time of the other of the delayed or non-delayed frequency steps. In certain applications, it is considered that an RF switch with speeds of two or three nanoseconds will be used.

The utilization device or apparatus 41 may be any conventional apparatus, such as a transmitter for example, to radiate by way of antenna 43 the frequency noise.

In operation, and referring to FIG. 3, waveform 50 represents the non-delayed output frequencies F1, F2, and F3 occurring on line 35 and the terminal 40 of the switch 37. Waveform 51 represents the delayed output frequencies F1, F2, and F3 occurring at terminal 39 of the switch 37 from the delay device 36. The slanted portions of the lines 50 and 51 referred to as F1,2 and F2,3 represent the rise time or in other words, the time required to shift from one frequency to the next frequency. Thus, the response time of the VCO 32, or in other words, the time required to generate and shift from one desired frequency to the next is comprised of both the horizontal line portions F1, F2, and F3, and its following slant portion F1,2, and F2,3, respectively. Such response time for each represented frequency step or change is referred to as time RT between adjacent vertically dashed demarcations referred to as 53 above the waveforms 50 and 51 of FIG. 3. From FIG. 3 it is apparent that the line 51 is delayed sufficiently relative to the line 50 such that the rise times of each of the waveforms 50, 51 occurs during the time of generation of the desired frequency of the other of the waveforms 50, 51. Although it is contemplated that this delay time is at least equal to the rise time of the other, it is to be understood that such delay could be slightly less if the requirements of the installation permitted a slight transient at the beginning or end of each frequency. However, it is contemplated that such a delay provides at least an overlap of the delayed and non-delayed portions so that little or no rise time of both the delayed and non-delayed portions occur concomitantly.

The switch 37 is operated by the clock 38 at twice the rate of the clock 31 and synchronized so that the non-delayed frequency on VCO output 35 is switched to conduct through contacts 40 and 42 to utilization device 41 at times represented by the dashed lines 54, 55, 56, and 57 of FIG. 3. The switch 37 operates to conduct the delayed VCO output at times represented by the dashed lines 58, 59, and 60 of FIG. 3. Thus, the frequencies of each of the delayed and non-delayed outputs of the VCO are output to the utilization device 41 during the rise times of the other to obtain the abrupt frequency steps generally represented by curve 61 of FIG. 3. This virtually eliminates the rise times of each frequency without increasing the response time of the VCO and improves the spectrum. It is understood that the amount of the delayed output and the rate of operation of the switch 37 will vary in accordance with the particular installations; and that the representation of FIG. 3 is shown to more readily understand the operating principle of the device rather than to show the actual waveforms that occur for a particular installation. The switching between delayed and non-delayed output will, depending upon the relative phase of the delayed output at each frequency step, result in phase shift keyed modulation being introduced. However, the nature and bandwidth of the noise spectrums being generated are such that spectrum spreading resulting from any phase shift keying will have little or no impact on noise spectral quality.

In summary, there has been shown and described an improved digital noise generating apparatus that improves the spectral quality of the noise while simultaneously reducing implementation costs by permitting the use of slower and less expensive voltage controlled oscillators.

What I claim is:

1. A digital noise generating system for producing at its output discrete pseudo-random frequencies, comprising
   first means to generate a voltage having rapidly changing discrete value steps,
   a voltage controlled oscillator responsive to said voltage to generate a first train of discrete frequencies, each frequency corresponding to one of the voltage steps,
   second means governed by the discrete frequencies of the first train to produce a second train of discrete frequencies, each being delayed by a predetermined interval to overlap the rise time of the next discrete frequency of the first train,
   switching means operative when activated to a first condition to output the frequencies of the first train and when operated to its second condition to output the frequencies of the second train, and
   third means to activate the switching means to its first and second condition alternately at a time and rate to output a portion of each discrete frequency of one of said trains during the rise time of such frequency of the other of said trains.

2. A system according to claim 1 wherein the second means includes means to delay each of the frequencies by an interval at least equal to the rise time of each of the discrete frequencies.

3. A system according to claim 1 wherein the second means includes means to delay each of the frequencies by an interval greater than the rise time of each of the discrete frequencies.

4. A system according to claim 1 wherein the third means is activated between the first and second trains at a rate corresponding to one-half the duration of each discrete frequency.

5. A system according to claim 1 wherein the first means, comprises
   a shift register operative to generate a series of digital words in a pseudo-random sequence,
   a digital to analog converter to transform each said word to discrete voltage value,
   means to scale each of said discrete values to produce a plurality of values, each of said plurality corresponding to a different band of frequencies, and means to multiplex each of said plurality of discrete values to produce the rapidly changing discrete voltage steps.

6. A system according to claim 5 wherein the shift register includes means to generate digital words at approximately a six megahertz rate.

7. A noise generating system for transmitting rapidly changing frequencies comprising
- a shift register operative to generate pseudo-random digital codes in succession at a predetermined rate, each code being representative of a discrete frequency,
- a digital to analog converter responsive to said generated codes to produce an analog signal, the value of which changes in accordance with each generated frequency code,
- a plurality of multipliers, each operative to scale the amplitude of the analog signal to conform to a predetermined different bandwidth of frequencies,
- a summing device for each multiplier operative to add a bias to the changing scaled analog signals to determine a value corresponding to the center frequency of its respective bandwidth,
- a first switch operative to multiplex the output signals of each summing device at a predetermined rate to produce an analog signal for each of the bandwidths in predetermined sequence,
- a voltage controlled oscillator responsive to each multiplexed voltage rate to generate at a first output a direct corresponding frequency,
- a delay line operatively connected to respond to each direct frequency to produce at a second output the same frequency but delayed in time at least equal to the rise time of the direct frequency,
- switching means including a third output pivotally connected to said first and second outputs to electrically couple to the third output said direct and delayed frequencies at times and at a rate to eliminate substantially the rise times of each said direct and delayed frequency, and
- means connected to the third output to transmit the selected portions of each of the direct and delayed frequencies.

* * * * *